United States Patent
Chang et al.

(10) Patent No.: US 10,861,857 B2
(45) Date of Patent: Dec. 8, 2020

(54) METHOD OF MAKING A CAPACITOR ELECTRODE OF A MEMORY DEVICE HAVING ALTERNATELY STACKED OXIDES AND NITRIDES OVER A SACRIFICIAL LAYER

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/019,552

(22) Filed: Jun. 27, 2018

(65) Prior Publication Data
US 2019/0363091 A1 Nov. 28, 2019

(30) Foreign Application Priority Data
May 28, 2018 (CN) .......................... 2018 1 0520810

(51) Int. Cl.
*H01L 27/108* (2006.01)
*H01L 21/311* (2006.01)
*H01L 49/02* (2006.01)

(52) U.S. Cl.
CPC ...... *H01L 27/10855* (2013.01); *H01L 21/311* (2013.01); *H01L 27/1085* (2013.01); *H01L 27/10808* (2013.01); *H01L 27/10852* (2013.01); *H01L 28/40* (2013.01); *H01L 28/90* (2013.01); *H01L 28/92* (2013.01)

(58) Field of Classification Search
CPC ........... H01L 27/1085; H01L 27/10852; H01L 27/10855; H01L 28/90; H01L 28/92; H01L 28/40
See application file for complete search history.

(56) References Cited

U.S. PATENT DOCUMENTS

| | | | |
|---|---|---|---|
| 6,064,085 A | 5/2000 | Wu |
| 6,100,129 A | 8/2000 | Tu |
| 6,483,141 B2 | 11/2002 | Sano |
| 6,624,018 B1 | 9/2003 | Yu |
| 6,815,752 B2 | 11/2004 | Kitamura |
| 9,496,266 B2 | 11/2016 | Kim et al. |
| 9,627,469 B2 | 4/2017 | Yi et al. |
| 9,853,032 B2 | 12/2017 | Seo |

(Continued)

*Primary Examiner* — Ermias T Woldegeorgis
(74) *Attorney, Agent, or Firm* — Winston Hsu (57) ABSTRACT

A semiconductor memory device and a method of forming the same are provided, with the semiconductor memory device including a substrate, a stacked structure, plural openings, plural flared portions and an electrode layer. The stacked structure is disposed on the substrate and includes alternately stacked oxide material layers and stacked nitride material layers. Each of the openings is disposed in the stacked structure, and each of the flared portions is disposed under each of the openings, in connection with each opening. The electrode layer is disposed on surfaces of each opening and each flared portion.

13 Claims, 7 Drawing Sheets

(56) References Cited

U.S. PATENT DOCUMENTS

| | | | |
|---|---|---|---|
| 2004/0159909 A1* | 8/2004 | Kim | H01L 28/91 |
| | | | 257/532 |
| 2006/0063324 A1* | 3/2006 | Park | H01L 27/10852 |
| | | | 438/239 |
| 2006/0199329 A1 | 9/2006 | Lee | |
| 2016/0379985 A1 | 12/2016 | Choi et al. | |

* cited by examiner

METHOD OF MAKING A CAPACITOR ELECTRODE OF A MEMORY DEVICE HAVING ALTERNATELY STACKED OXIDES AND NITRIDES OVER A SACRIFICIAL LAYER

BACKGROUND OF THE INVENTION

1. Field of the Invention

The present invention relates to a semiconductor memory device and a method of forming the same, and more particularly, to a dynamic random access memory (DRAM) device and a method of forming the same.

2. Description of the Prior Art

Dynamic random access memory (DRAM) is a kind of volatile memory and an indispensable key component in many electronic products. DRAM which is arranged from a large number of memory cells to form an array area for save information. Each memory cell consists of a metal oxide semiconductor (MOS) transistor and a capacitor in series.

As the accumulation of DRAMs increases, it becomes more difficult to establish an electrical connection between each memory cell and each memory cell. At the same time, there are many different structural designs for the crystal structure and capacitor structure in each memory cell due to product requirements or/and density of memory cells. Therefore, how to develop a DRAM structure with maintaining performance and manufacturing process has always been the technical direction of continuous efforts in the field.

SUMMARY OF THE INVENTION

It is one of the primary objectives of the present invention to provide a semiconductor memory device, in which the storage node (SN) pad disposed between the capacitor structure and the storage node contact (SNC) is omitted, and an expanding portion is additionally disposed at the electrode layer of the capacitor structure for retaining the connection between the capacitor structure and the storage node contact. That is, the semiconductor memory device may gain better performance under a simplified structure.

It is one of the primary objectives of the present invention to provide a method of forming a semiconductor memory device, in which the formation of the storage node (SN) pad between the capacitor structure and the storage node contact (SNC) is omitted, and a sacrificial layer is additionally formed to configure as a stop layer while forming the opening of the capacitor structure. Also, the sacrificial layer is further used to form an expanding portion at the bottom of the electrode layer of the capacitor structure, so that, the expanding portion may gain a better connection between the capacitor structure and the storage node contact. That is, the semiconductor memory device may therefore obtain better performance under a simplified process flow.

To achieve the purpose described above, the present invention provides a semiconductor memory device including a stacked structure, a plurality of openings, a plurality of expanding portions and an electrode layer. The stacked structure is disposed on a substrate, and the stacked structure includes at least one oxide material layer and at least one nitride material layer stacked alternately on the substrate. The openings are disposed in the stacked structure, and the expanding portions are disposed below the openings, wherein each of the expanding portions is in connection with each of the openings. The electrode layer is disposed on surfaces of the openings and the expanding portions.

To achieve the purpose described above, the present invention provides a method of forming a semiconductor memory device including the following steps. Firstly, a sacrificial layer is formed on a substrate, and a stacked structure is formed on the sacrificial layer, with the stacked structure including at least one oxide material layer and at least one nitride material layer stacked alternately on the sacrificial layer. Next, a mask layer is formed on the stacked structure, and the stacked structure is patterned through the mask layer, to form a plurality of openings in the stacked structure to expose a portion of the sacrificial layer. Following these, the mask layer and the portion of the sacrificial layer are removed, and then, after forming an electrode layer on surfaces of each openings, the at least one oxide material layer in the stacked structure is completely removed. Finally, the sacrificial layer is completely removed.

Overall speaking, the semiconductor memory device of the present invention improves the possible poor connection or the short circuit issue at the same time through the modify process. Although omitting the conductive pads disposed between the capacitor structure and the storage node contacts, the semiconductor memory device utilizes the additionally disposed sacrificial layer not only to avoid the possible over-etching issue through the openings, but also to form the corresponding expanding portions at the bottom of the capacitor structure. Accordingly, the corresponding expanding portions may enhance the connection between the storage node contacts and the capacitor structure, and also increase the capacitance of the capacitor structure via the increased bottom area thereof. With such arrangement, the semiconductor memory device may therefore obtain a better performance under a simplify process with some completely processes like the formation of the conductive pads being omitted.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic diagrams illustrating a method of forming a semiconductor memory device according to a first preferred embodiment of the present invention, wherein:

FIG. 4 to FIG. 12 are schematic diagrams illustrating a method of forming a semiconductor memory device according to a second preferred embodiment of the present invention, wherein:

FIG. 13 to FIG. 14 are schematic diagrams illustrating a method of forming a semiconductor memory device according to a third preferred embodiment of the present invention, wherein:

DETAILED DESCRIPTION

To provide a better understanding of the present invention, preferred embodiments will be described in detail. The preferred embodiments of the present invention are illustrated in the accompanying drawings with numbered elements.

Figure 1:
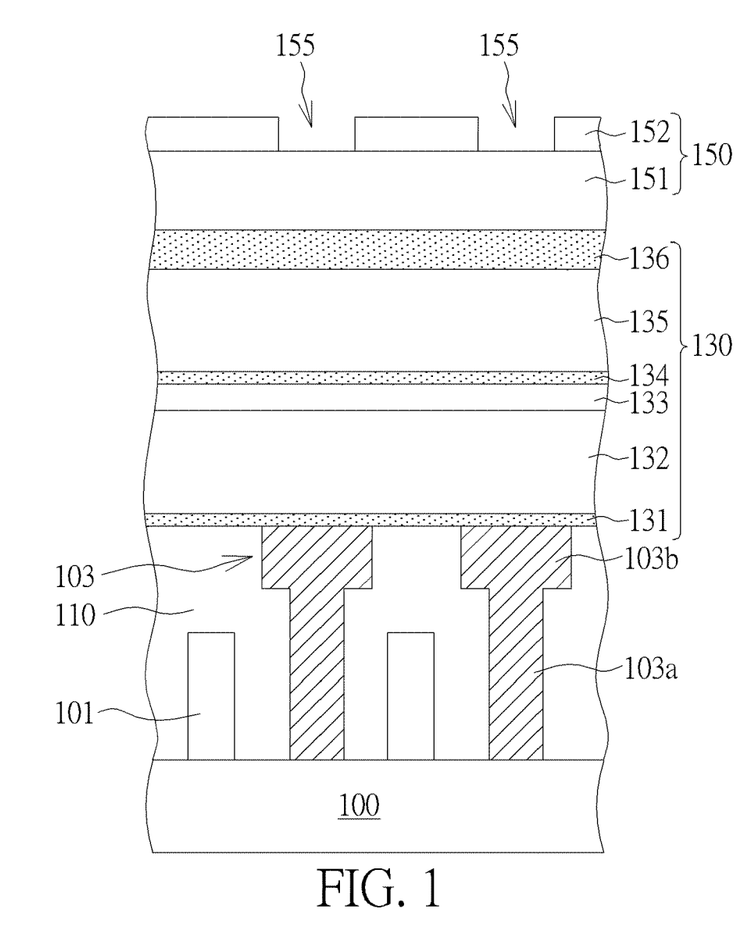
FIG. 1 shows a cross-sectional view of a semiconductor memory device at the beginning of the forming process.
Figure 2:
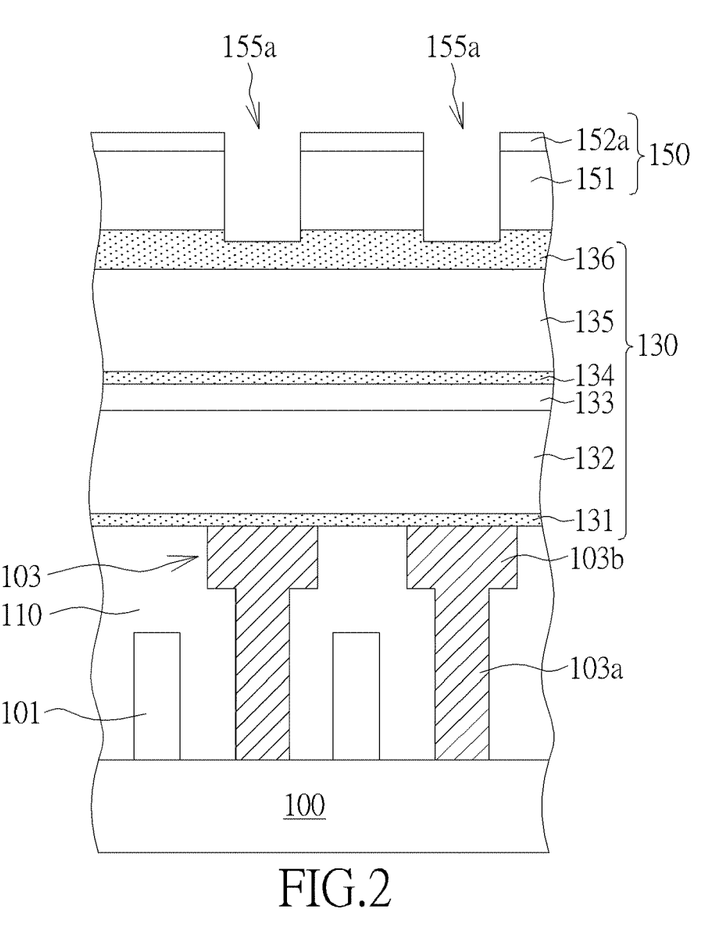
FIG. 2 shows a cross-sectional view of a semiconductor memory device after forming a primary opening.
Figure 3:
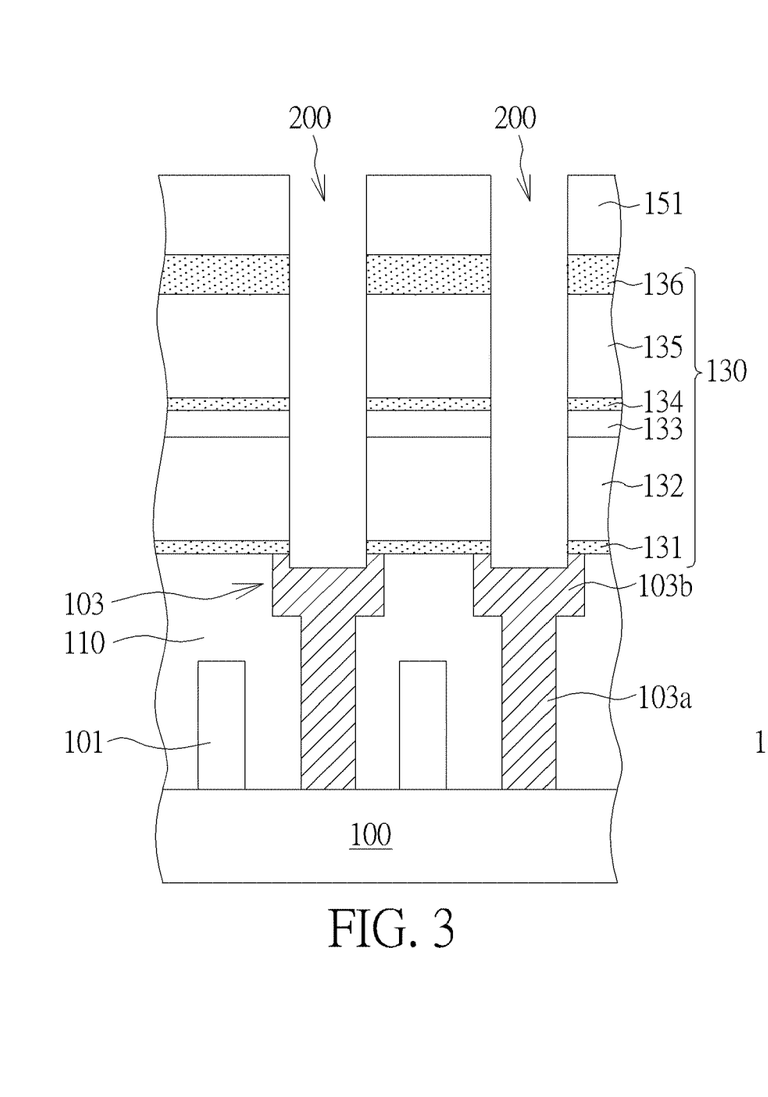
FIG. 3 shows a cross-sectional view of a semiconductor memory device after forming a contact opening.

Please refer to FIGS. 1-3, a forming method of a semiconductor memory device according to the first preferred embodiment of the present invention is illustrated. In the present embodiment, the semiconductor memory device is for example a dynamic random access memory (DRAM) device, which includes at least one transistor (not shown in the drawings) and at least one capacitor structure (not shown in the drawings), thereto serve as the smallest unit in the DRAM array for accepting signals from word lines (not shown in the drawings) and bit lines 101 during the operation.

Firstly, a substrate 100 such as a silicon substrate, a silicon containing substrate (such as SiC, SiGe) or a silicon-on-insulator (SOI) substrate is provided, a buried transistor (not shown in the drawings) is formed in the substrate 100 to function like the word line, and the bit line structure 101 and a conductive structure 103 are formed within a dielectric layer 110 on the substrate 100. The dielectric layer 110 for example includes silicon nitride (SiN), but is not limited thereto. Precisely, the bit line structure 101 is electrically connected to a source/drain region (not shown in the drawings) of the transistor structure through a bit line contact (BLC, not shown in the drawings) disposed below a part of the bit line structure 101, and the conductive structure 103 is electrically connected to another source/drain region (not shown in the drawings) of the transistor structure. Also, the conductive structure 103 includes a plug 103a disposed at the bottom thereof, and a conductive pad 130b disposed at the top thereof, so that the conductive structure 103 may therefore perform like a T-shape. The plug 103a is directly in contact with the another source/drain region of the transistor structure, to configure as a storage node contact (SNC), and the conductive pad 130b is disposed over the plug 103a to configure as a storage node (SN) pad.

As shown in FIG. 1, a stacked structure 130 and a mask structure 150 are sequentially formed on the dielectric layer 110. The stacked structure 130 includes plural films with various materials alternately stacked on one over another. In the present embodiment, the stacked structure 130 includes a first layer 131 for example a nitride material layer including SiN or silicon carbonitride (SiCN), a second layer 132 for example including borophosphosilicate glass (BPSG), a third layer 133 for example an oxide material layer including silicon dioxide ($SiO_2$), a fourth layer 134, a fifth layer 135 and a sixth layer 136 stacked from bottom to top. In one embodiment, the fourth layer 134 and the sixth layer 136 include the same material as that of the first layer 131, such as also being a nitride material layer including SiCN or SiN, and the fifth layer 135 includes the same material as the third layer 133, such as also being an oxide material layer including $SiO_2$. That is, the stacked structure 130 namely includes alternately stacked nitride material layers and oxide material layers. In another embodiment, the second layer 132 and the fifth layer 135 preferably include a relative greater thickness than that of other stacked layers. For example, the thickness of the second layer 132 or the fifth layer 135 is about 5 times greater than that of the first layer 131, but is not limited thereto. Then, the entire thickness of the stacked structure 130 is about 1600 angstroms to 2000 angstroms, but not limited thereto.

On the other hand, the mask structure 150 also includes plural films with various materials alternately stacked on one over another, and which may include a first mask layer 151, a second mask layer 152 for example including silicon oxide, a third mask layer (not shown in the drawings) for example including organic dielectric layer (ODL), a fourth mask layer (not shown in the drawings) for example including silicon-containing hard mask (SHB), and a fifth mask layer (not shown in the drawings) for example including a photoresist layer like KrF, stacked from bottom to top. The fifth mask layer may include at least one opening patterns (not shown in the drawings) through firstly performing an exposure process. In one embodiment, the opening patterns of the fifth layer are sequentially transferred to the second mask layer 152, and the fifth layer, and the fourth layer and the third layer are then removed, to form the stacked structure 150 as shown in FIG. 1, with the second mask layer 152 including a plurality of corresponding opening patterns 155. It is noted that, the first mask layer 152 preferably includes a material having a great etching selectivity related to the materials of each stacked layers of the stacked structure 130, such as being amorphous silicon (a-Si), but is not limited thereto.

Next, an etching process such as a dry etching process is performed to transfer the opening patterns 155 of the second mask layer 152 into the first mask layer 151 and a portion of the stacked structure 130 (namely, a portion of the sixth layer 136) underneath, to form a plurality of primary openings 155a to expose a portion of the sixth layer 136, as shown in FIG. 2. It is noted that, although the etching process is performed by using the second mask layer 152 as an etching mask, a portion of the second mask layer 152 may also be removed while etching the first mask layer 151 and the sixth layer 136. That is, a second mask layer 152a with a relative smaller height (thickness) is formed accordingly.

Then, the second mask layer 152a is used as another etching mask to perform another etching process such as a dry etching process, to further etching the stacked structure 130 (including the sixth layer 136, the fifth layer 135, the fourth layer 134, the third layer 133, the second layer 132 and the first layer 131) through the primary openings 155a, to form a plurality of corresponding openings 200 in the stacked structure 130 to expose the conductive structure 103 within the dielectric layer 110, as shown in FIG. 3. In one embodiment, while forming the primary openings 155a and the openings 200, the etched first mask layer 151 is therefore exposed and further reacted with the atmosphere in the environment, to form an oxide layer (not shown in the drawings) on exposed surface of the first mask layer 151. The oxide layer may be completely removed while removing the first mask layer 151 in the subsequent process, and which will not be redundantly described hereinafter.

Following these, the second mask layer 152a and the first mask layer 151 are completely removed, and an electrode layer (not shown in the drawings) is then formed in the openings. Also, after removing the oxide material layers of the stacked structure 130, other elements such as a capacitor dielectric layer and another electrode layer are further formed on the electrode layer, to form the capacitor structure of the semiconductor memory device.

Through the above-mentioned processes, the method of forming a semiconductor memory device according to the first preferred embodiment of the present invention is completed. According to the forming method of the present embodiment, the conductive pads 103b with a greater size is formed on the plugs 103a to together configure as the conductive structures 103, and the capacitor structure is then formed thereon. In other words, the semiconductor memory device of the present embodiment utilizes the conductive pads 103b to enhance the connection between the conductive structures 103 and the capacitor structure disposed over the conductive structures 103, so as to avoid the defects in the subsequent processes resulting in the dislocation of the capacitor structure. Thus, the semiconductor memory device may therefore obtain a better performance thereby.

It is also noted that, in the etching process of the present embodiment, the first layer 131 including a nitride material layer is used as a stop layer, for avoid the over-etching issues. However, under some situation, if the openings 200 are over dislocated in the stacked structure 130, the openings 200 may be formed beyond the extending area of the conductive pad 103b underneath. At this time, the dielectric layer 110 may be easy to penetrate through during the etching process because the dielectric layer 110 includes similar material to that of the stacked structure 130. Accordingly, while the electrode layer is formed in the subsequent process, the electrode layer may therefore fill in the penetrated dielectric layer 110, to form a tiger tooth extension on the capacitor structure. The tiger tooth extension is downward extended from the capacitor structure, and which may cause possible short circuit between the conductive structure 103 and the bit line structures 101 at two sides of the conductive structure 103.

For avoiding said short circuit issue, people in the art shall easily realize that the method of forming the semiconductor memory device of the present invention is not limited to be formed through the aforementioned processes, and may also be formed through other forming methods. The following description will detail the different embodiments of the method of forming the semiconductor memory device. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIGS. 4-12, forming method of a semiconductor memory device according to the second preferred embodiment of the present invention is illustrated. The formal steps in the present embodiment are similar to those in the aforementioned first embodiment, and the differences between the two embodiments are in that, the conductive pads 103b formed over the plugs 103a are omitted in the present embodiment, and a sacrificial layer 138 is additionally formed.

Figure 4:
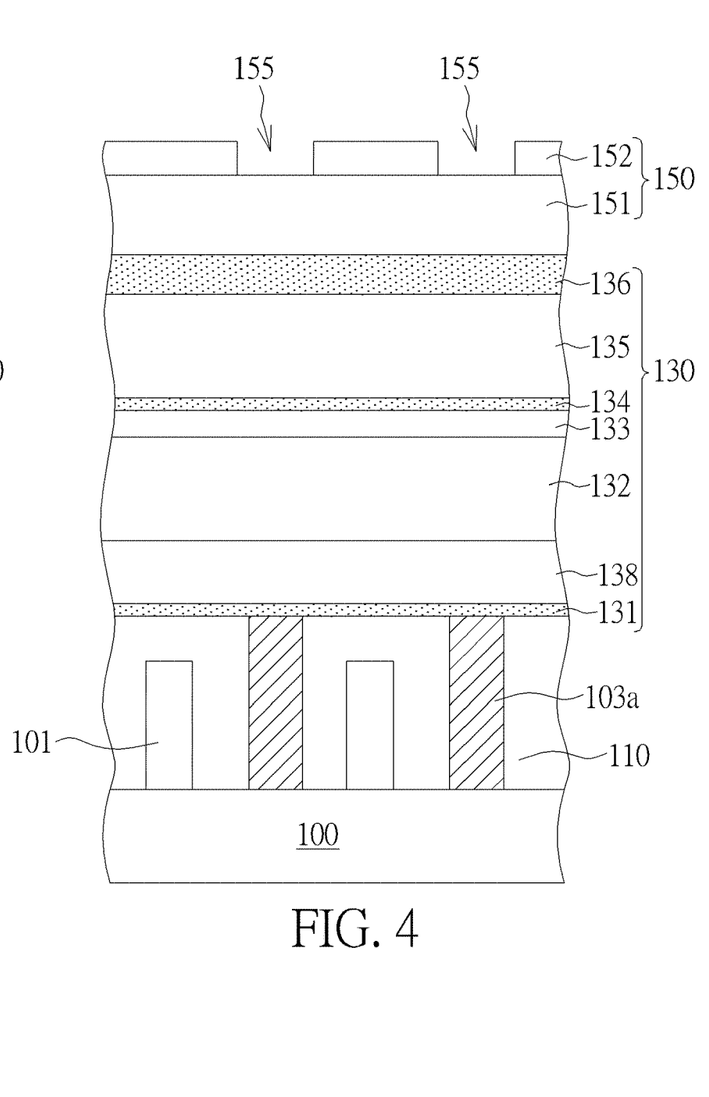
FIG. 4 shows a cross-sectional view of a semiconductor memory device at the beginning of the forming process.

Precisely, the bit lines structure 101 and the conductive structures 103 are also alternately disposed on the dielectric layer 110 in the present embodiment, and the conductive structure 103 only includes the plugs 103a which is directly in contact with the source/drain region of the transistors, with the conductive pads being omitted. That is, each of the conductive structures in the present embodiment may perform like an I-shape. Also, the stacked structure 130 and the mask structure 150 are formed on the dielectric layer 110, and the sacrificial layer 138 is additionally formed between the first layer 131 and the second layer 132 of the stacked structure 130, as shown in FIG. 4. It is noted that, the sacrificial layer 138 includes a material having a greater etching selectivity relative to that of the nitride material layer (namely the first layer 131, the fourth layer 134 and the sixth layer 136) and the oxide material layer (namely, the third layer 133 and the fifth layer 135) of the stacked structure 130, such as being silicon or amorphous silicon but not limited thereto. For example, the etching selectivity relative between the sacrificial layer 138, the nitride material layer and the oxide material layer is about 1:1:10. Furthermore, the sacrificial layer 138 preferably includes a relative greater thickness, for example being about 3-5 times greater than that of the first layer 131, but not limited thereto.

Figure 5:
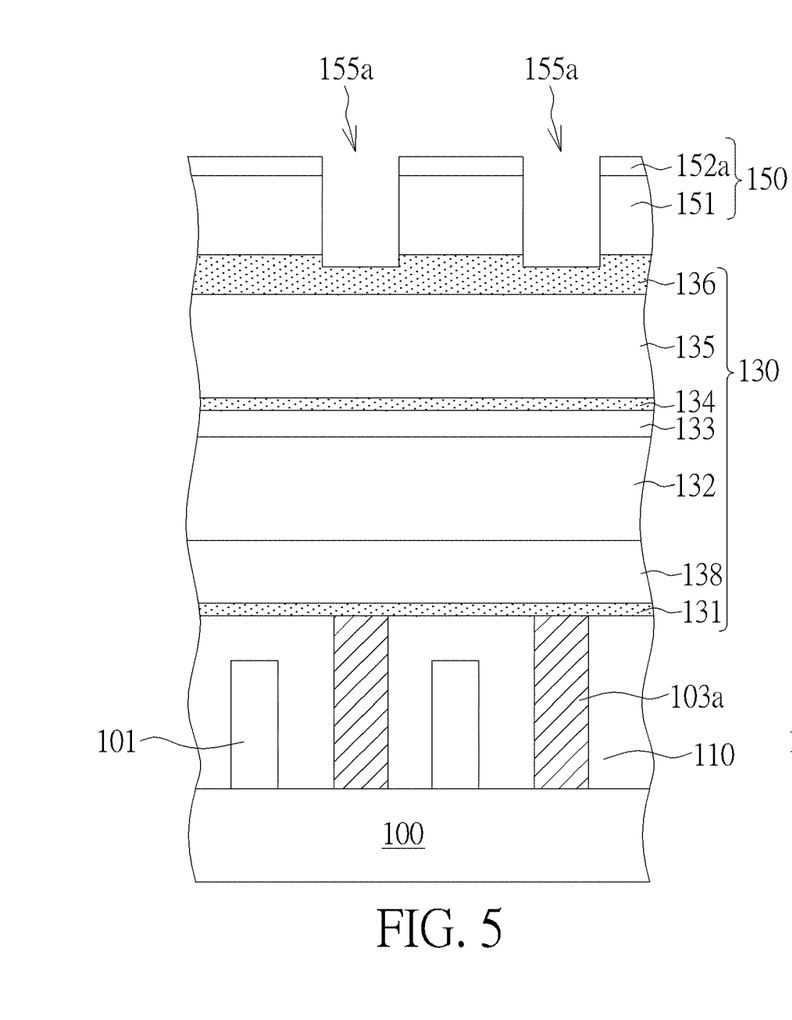
FIG. 5 shows a cross-sectional view of a semiconductor memory device after forming a primary opening.
Figure 6:
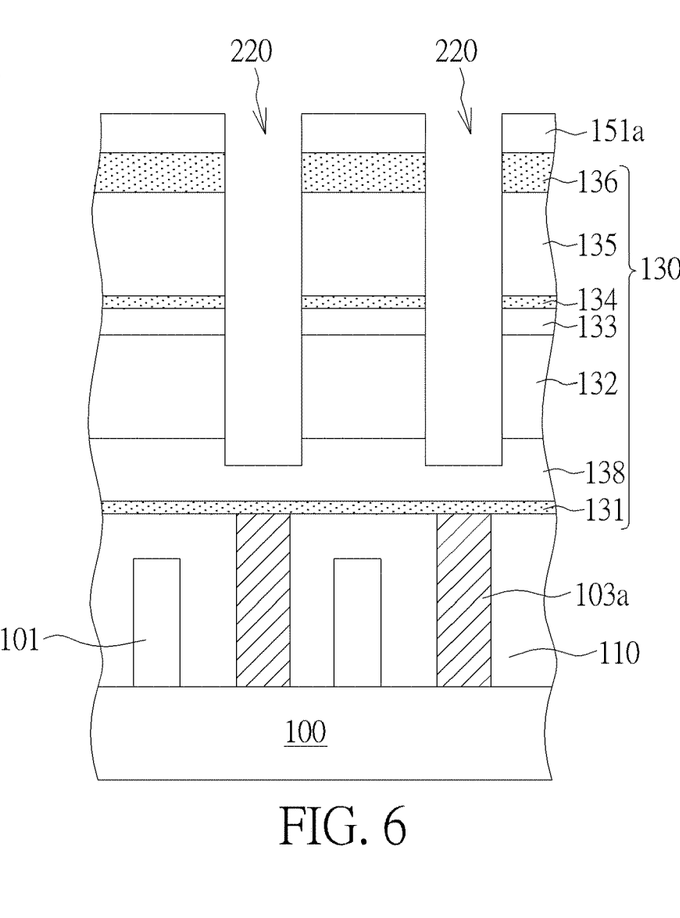
FIG. 6 shows a cross-sectional view of a semiconductor memory device after further etching the primary opening.

Except for the aforementioned difference, other features such as the materials or the thickness of each stacked layers of the stacked structure 130 are all similar to those in the first preferred embodiment, and the second mask layer 152 also includes a plurality of opening patterns 155, and those will not be redundantly described hereinafter. As shown in FIG. 5, an etching process such as a dry etching process is performed to transfer the opening patterns 155 of the second mask layer 152 into the first mask layer 151 and a portion of the stacked structure 130 (namely, a portion of the sixth layer 136) underneath, to form a plurality of primary openings 155a. Then, as shown in FIG. 6, another etching process such as a dry etching process is performed to further etching the stacked structure 130 (including the sixth layer 136, the fifth layer 135, the fourth layer 134, the third layer 133 and the second layer 132) through the primary openings 155a, to form a plurality of corresponding openings 220 in the stacked structure 130 to expose the sacrificial layer 138. It is noted that, although the another etching process is performed by using the second mask layer 152a as an etching mask, the second mask layer 152a and a portion of the first mask layer 151 underneath may also be removed while etching the stacked structure 130. That is, a first mask layer 151a with a relative smaller height (thickness) is formed accordingly. Meanwhile, the thickness of the first mask layer 151a is preferably the same as that of the exposed sacrificial layer 138, as shown in FIG. 6.

Figure 7:
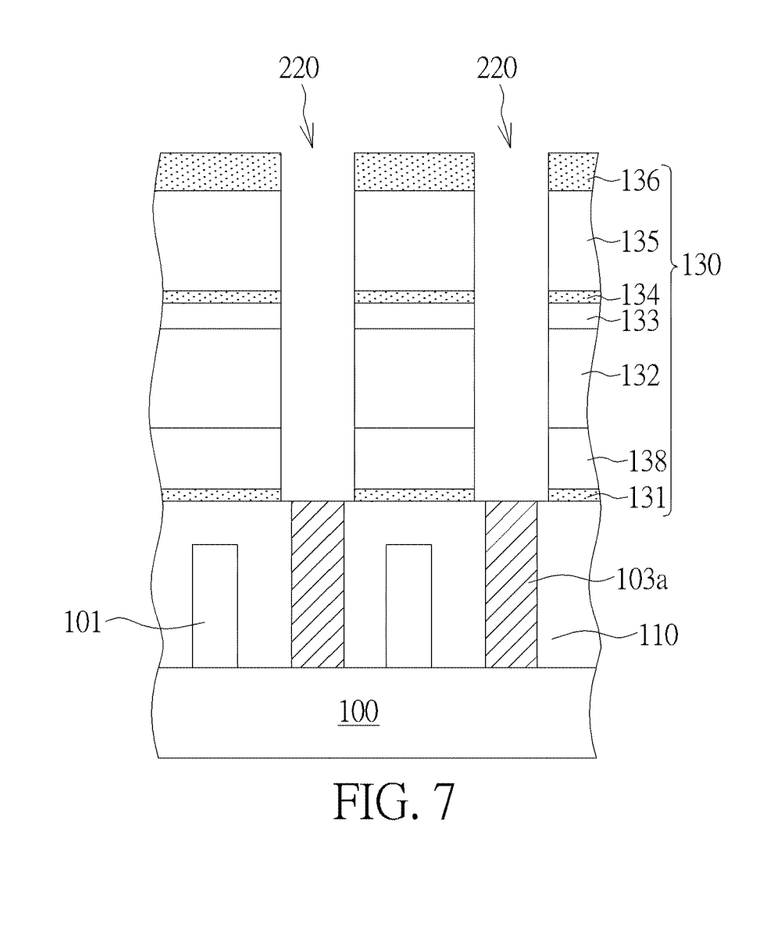
FIG. 7 shows a cross-sectional view of a semiconductor memory device after forming a contact opening.
Figure 8:
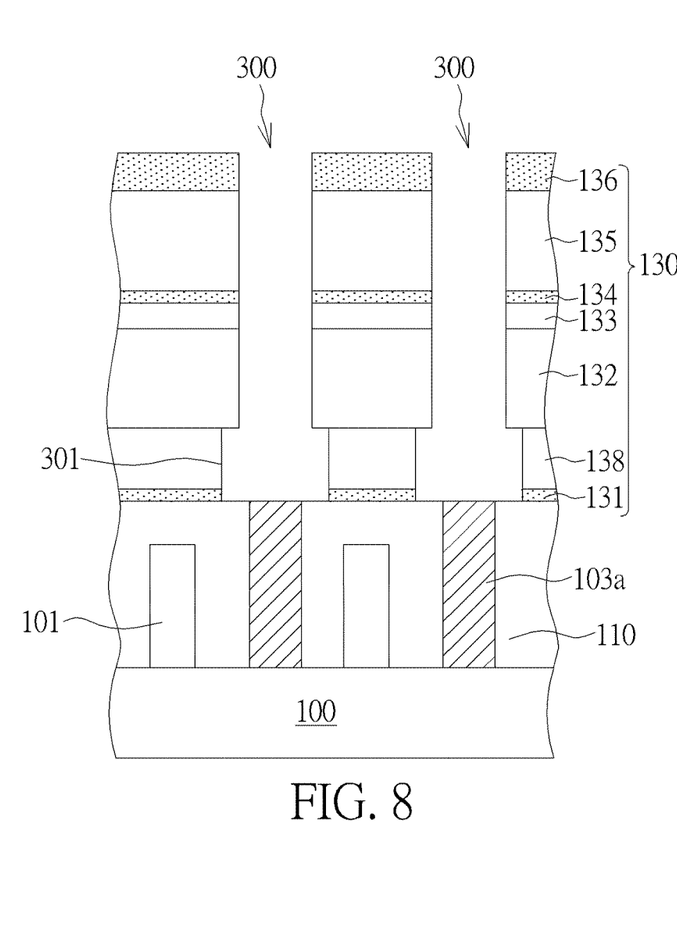
FIG. 8 shows a cross-sectional view of a semiconductor memory device after further etching a bottom of the contact opening.

Next, the sacrificial layer 138 is further etched, to form a plurality of expanding portions 301 in the sacrificial layer 138 to connect each opening 220 respectively. Firstly, an etching process such as an anisotropic etching process is performed by using the similar features between the first mask layer 151a and the sacrificial layer 138, to simultaneously remove the first mask layer 151a and a portion of the sacrificial layer 138, to exposed the first layer 131 underneath from the openings 220. After that, the exposed portion of the first layer 131 is continuously removed, to expose the plugs 103a formed within the dielectric layer 110, as shown in FIG. 7. Then, a lateral etching process is performed to further remove sidewalls of the sacrificial layer 138 and the first layer 131 to form the expanding portions 301 in connection with the openings 220 respectively, thereby forming the openings 300 as shown in FIG. 8. In other words, each of the openings 300 includes a portion disposed within the sacrificial layer 138 and the first layer 131 to obtain a relative greater dimension, so as to form the expanding portion 301. The rest portions (namely the portions disposed within the sixth layer 136, the fifth layer 135, the fourth layer 134, the third layer 133 and the second layer 132) of each of the openings 300 are not lateral etched, to retain the same dimension as that of the aforementioned openings 220.

Figure 9:
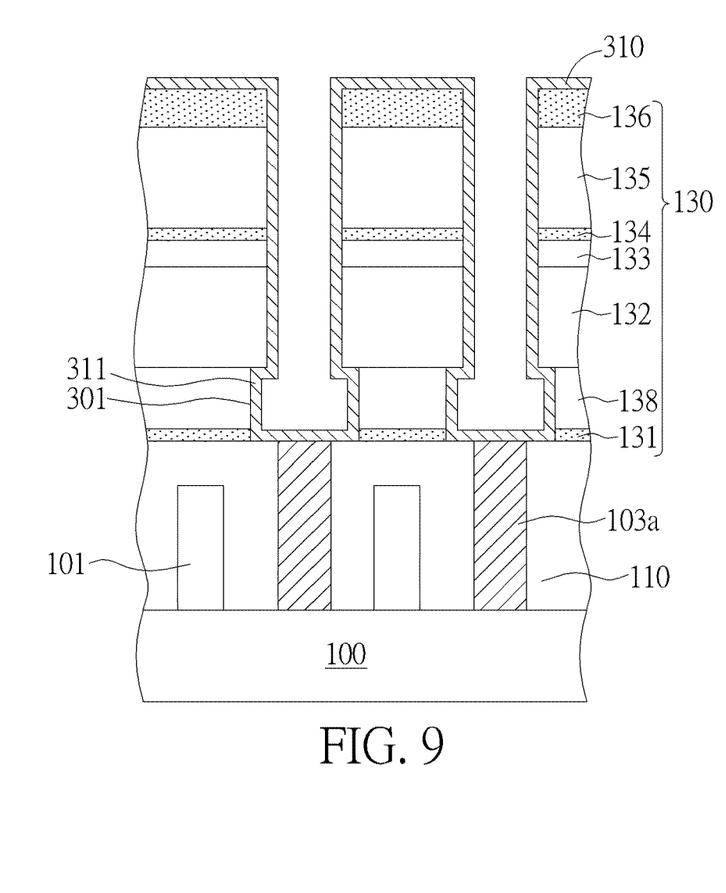
FIG. 9 shows a cross-sectional view of a semiconductor memory device after forming an electrode layer.
Figure 10:
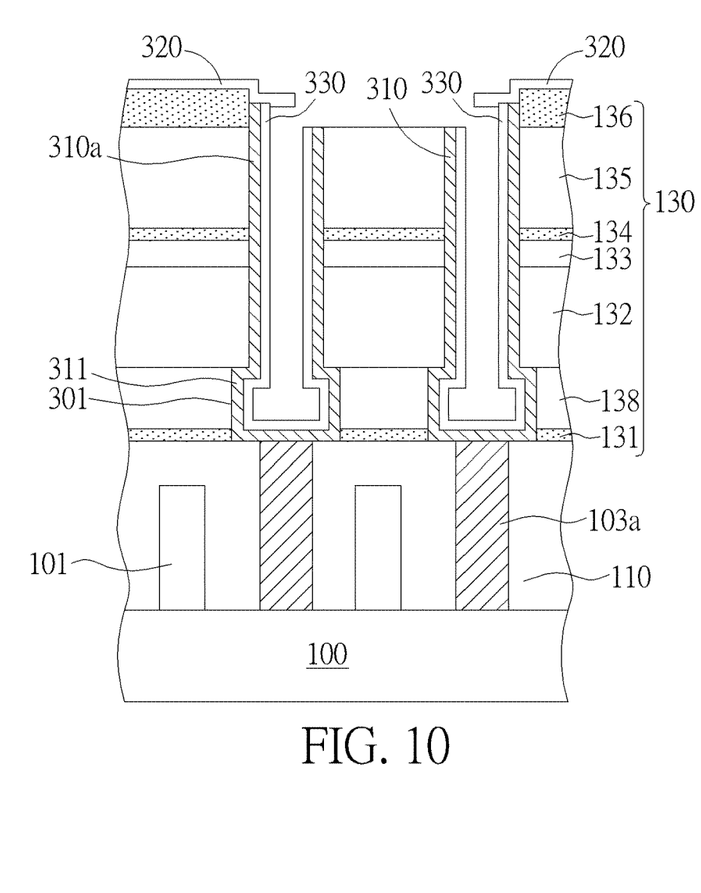
FIG. 10 shows a cross-sectional view of a semiconductor memory device after forming a mask layer.
Figure 11:
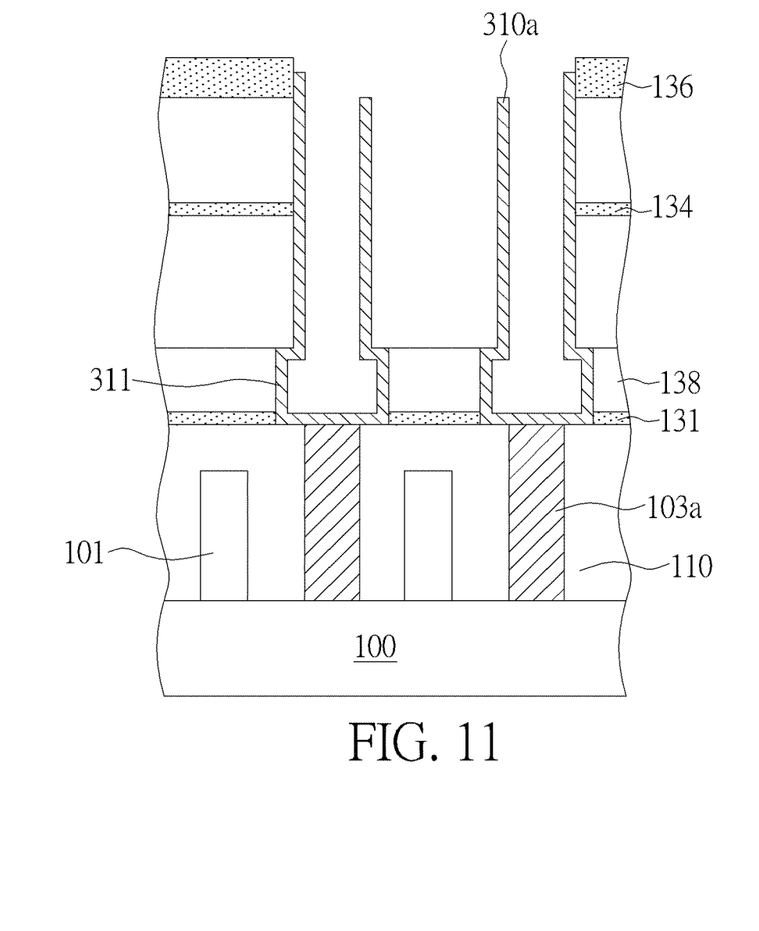
FIG. 11 shows a cross-sectional view of a semiconductor memory device after removing a portion of the stacked structure.
Figure 12:
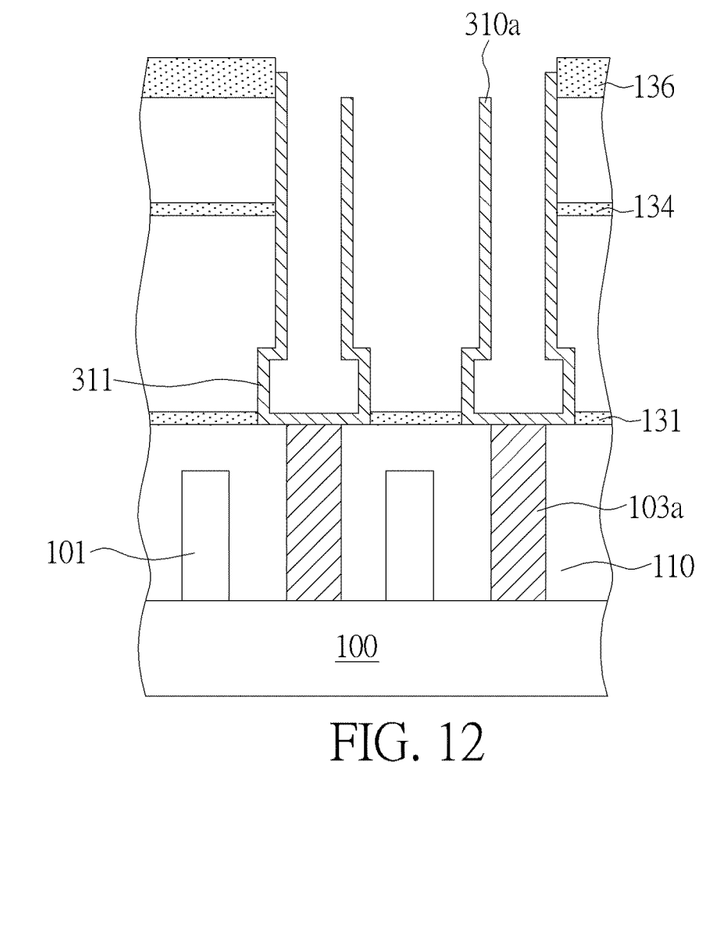
FIG. 12 shows a cross-sectional view of a semiconductor memory device after removing sacrificial layer.

Following these, an electrode layer 310 is formed in the openings 300, with the electrode layer 310 being conformally formed on surfaces of the openings 300 to form corresponding expanding portions 311 at the bottom thereof, as shown in FIG. 9. Subsequently, the oxide material layers (namely, the fifth layer 135, the third layer 133 and the second layer 132) of the stacked structure 130 are removed, the sacrificial layer 138 is then removed, and other elements are formed on the electrode layer 310, to form the capacitor structure of the semiconductor memory device thereby. Precisely, in one embodiment, after forming the electrode layer 310, an oxide layer (not shown in the drawings) such as including silicon oxide is firstly formed to entirely cover on the electrode layer 310, and an etching back process is performed to partially removed the oxide layer and the electrode layer 310 disposed on the top surface (namely the surface of the sixth layer 136) of the stacked structure 130. That is, a silicon oxide layer 330 and an electrode layer 310a with top surfaces being lower than that of the stacked structure 130 is obtained, as shown in FIG. 10. Then, another oxide layer (not shown in the drawings) such as including silicon oxide is formed to cover the stacked structure 130 and to seal the openings 300, and an etching process is performed through a mask layer (not shown in the drawings), to partially remove the another oxide layer to form an oxide layer 320, with a portion of the top surface of the stacked structure 130 being exposed from the oxide layer 320. That is, a portion of the stacked structure 130 (namely a portion of the sixth layer 136) may be further removed through the exposed top surface thereof from the oxide layer 320, to form the structure as shown in FIG. 10. After that, as shown in FIG. 11, an etching process such as a wet etching process is performed to further remove the oxide material layers (namely, the fifth layer 135, the third layer 133 and the second layer 132) of the stacked structure 130 through the etched portion of the sixth layer 136, to only retain the nitride material layers of the stacked structure 130. As shown in FIG. 12, another etching process such as an anisotropic wet etching is further performed by using an etchant like tetramethylammonium hydroxide (TMAH) to completely remove the sacrificial layer 138, with a weight percentage of tetramethylammonium hydroxide being provided in about 1-10%. In one embodiment, 6 wt % TMAH and 94 wt % propylene glycol are provided to remove the sacrificial layer 138, but is not limited thereto. Following these, other elements such as a capacitor dielectric layer and another electrode layer may further be formed on the electrode layer 310, to form the capacitor structure of the semiconductor memory device.

Through the above-mentioned processes, the method of forming a semiconductor memory device according to the second preferred embodiment of the present invention is completed. According to the forming method of the present embodiment, the conductive pads 103b formed in the aforementioned first embodiment have been omitted, and the sacrificial layer 138 is additionally formed between the first layer 131 and the second layer 132 of the stacked structure 130, to function as a stop layer while forming the openings 220. It is noted that, since the sacrificial layer 138 has a relative greater thickness and a greater etching selectivity related to the oxide material layers and the nitride material layers of the stacked structure 130 and the dielectric layer 110, it is sufficient to avoid the aforementioned over-etching issue. After forming the openings 220, the first mask layer 151 and a portion of the sacrificial layer 138 are simultaneously removed through the same etching process. Also, the sacrificial layer 138 may be completely removed while removing the oxide material layers of the stacked structure 130 after the electrode layer 310 is formed. The sacrificial layer 138 is further used to form the expanding portions 301 which are in connection with the openings 220 respectively, so that, the electrode layer 310 formed subsequently may also form the corresponding expanding portions 311 conformally. In other words, although the conductive pads are omitted in the semiconductor memory device of the present embodiment, the electrode layer 310 of the semiconductor memory device in the present embodiment further forms the corresponding expanding portions 311 at the bottom of the capacitor structure through the aforementioned processes. In this way, the capacitor structure of the present embodiment may therefore obtain a larger dimension at the bottom and a smaller dimension at the top, so as to perform like an inverted T-shape. The increased area of the bottom of the capacitor structure is able to enhance the connection between the plugs 103a and the capacitor structure, so that it is sufficient to avoid any possible short circuit between the bit line structure 101 and the capacitor structure, or the poor connection between the plugs 103a and the capacitor structure. Thus, the semiconductor memory device may therefore obtain a better performance under a simplify process flow.

Overall speaking, the semiconductor memory device of the present invention improves the possible poor connection or the short circuit issue at the same time through the modify process. Although omitting the conductive pads disposed between the capacitor structure and the storage node contacts, the semiconductor memory device utilizes the additionally disposed sacrificial layer not only to avoid the possible over-etching issue through the openings, but also to form the corresponding expanding portions at the bottom of the capacitor structure. Accordingly, the corresponding expanding portions may enhance the connection between the storage node contacts and the capacitor structure, and also increase the capacitance of the capacitor structure via the increased bottom area thereof. With such arrangement, the semiconductor memory device may therefore obtain a better performance under a simplify process with some completely processes like the formation of the conductive pads being omitted.

Figure 13:
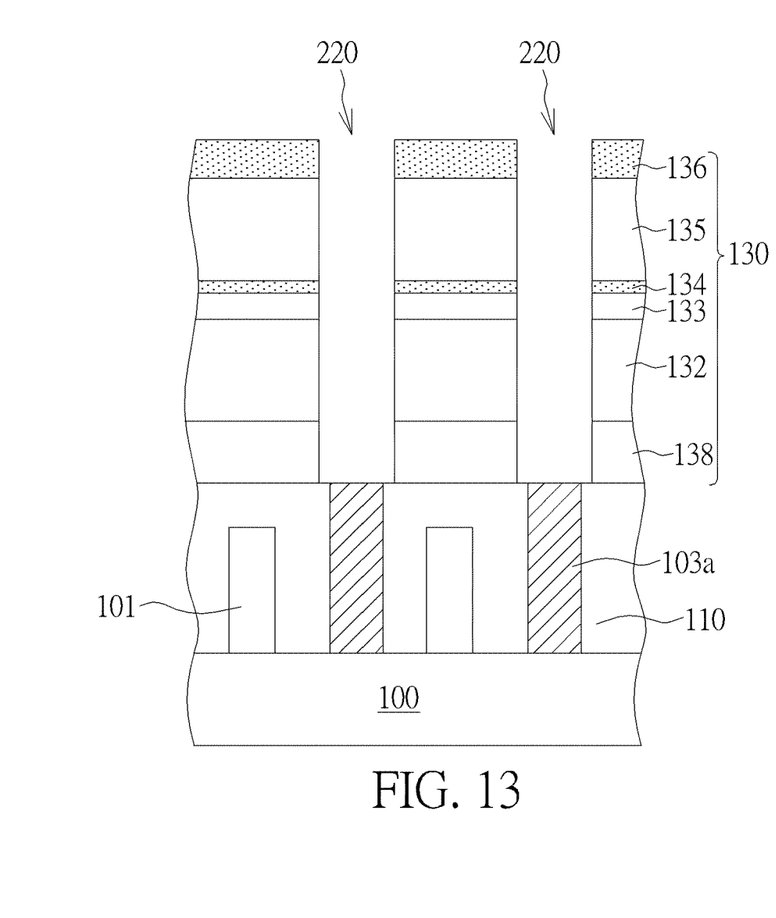
FIG. 13 shows a cross-sectional view of a semiconductor memory device after forming an electrode layer.
Figure 14:
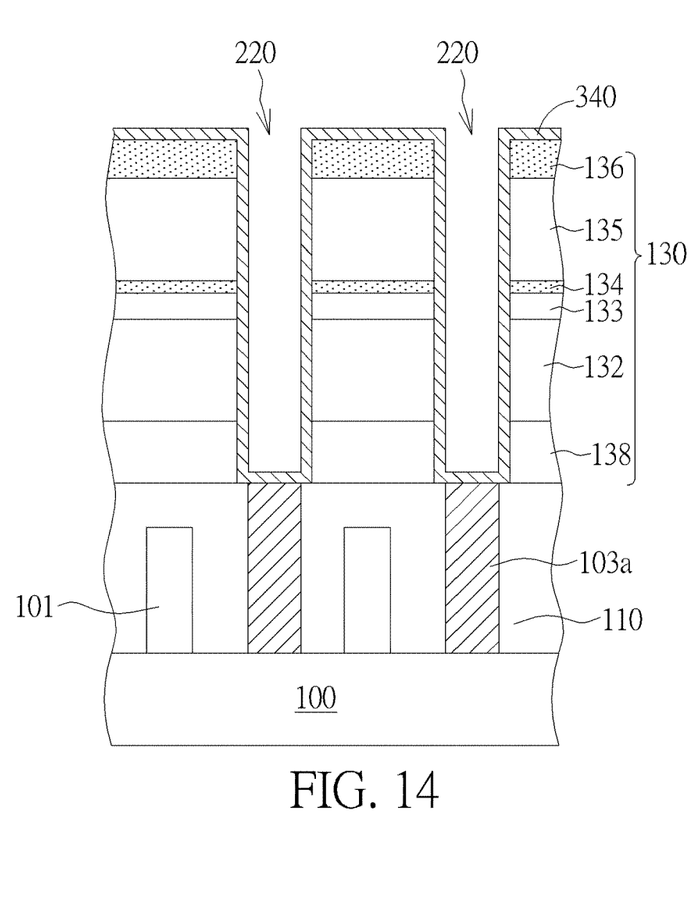
FIG. 14 shows a cross-sectional view of a semiconductor memory device after removing the sacrificial layer.

Furthermore, since disposing the sacrificial layer 138 may avoid the over-etching issue through the openings 220, the expanding portions 301 may also be omitted in some embodiments. In other words, after forming the structure as shown in FIG. 7, an electrode layer (not shown in the drawings) may be directly formed in the openings 220 followed by performing the subsequent processes. Otherwise, in another embodiment, the first layer 131 of the stacked structure 130 may be further omitted as shown in FIG. 13, so that, only the sacrificial layer 138 is used as a stop layer while forming the openings 220. Following these, the processes as shown in FIG. 9 of the aforementioned second embodiment may be performed, to form an electrode layer 340 in the openings 220, so that, the electrode layer 340 may no longer form the aforementioned corresponding expanding portion 311, so as to form the structure as shown in FIG. 14. Then, the subsequent processes as shown in FIGS. 10-12 of the aforementioned second embodiment may be continuously performed, to sequentially remove the oxide material layer of the stacked structure 130 and the sacrificial layer 138, and to form other elements on the electrode layer 340 to form the capacitor structure. With this arrangement, the conductive pads as well as the corresponding expanding portions are both omitted within the semiconductor memory device, so that, the semiconductor memory device is allowable to be formed under a further simplify process flow without leading to any possible short circuit or poor connection issues.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor memory device, comprising:
    forming a sacrificial layer on a substrate;
    forming a stacked structure on the sacrificial layer, the stacked structure comprising at least one oxide material layer and at least one nitride material layer stacked alternately on the sacrificial layer;
    forming a mask layer on the stacked structure;
    patterning the stacked structure through the mask layer, to form a plurality of openings in the stacked structure to expose a portion of the sacrificial layer;
    removing the mask layer and the portion of the sacrificial layer;
    after forming an electrode layer on surfaces of each openings, completely removing the at least one oxide material layer in the stacked structure; and
    completely removing the sacrificial layer.

2. The method of forming semiconductor memory device according to claim 1, wherein the sacrificial layer is completely removed by performing an anisotropic wet etching process.

3. The method of forming semiconductor memory device according to claim 2, wherein the anisotropic wet etching process is performed by providing tetramethylammonium hydroxide to remove the sacrificial layer.

4. The method of forming semiconductor memory device according to claim 3, wherein a weight percentage of tetramethylammonium hydroxide is about 1% to 10%.

5. The method of forming semiconductor memory device according to claim 1, further comprising:
    forming a plurality plugs in the substrate, before forming the sacrificial layer, wherein the plugs are exposed from the openings, after removing the portion of the sacrificial layer.

6. The method of forming semiconductor memory device according to claim 5, further comprising:
    forming another nitride material layer on the plugs before forming the sacrificial layer.

7. The method of forming semiconductor memory device according to claim 6, wherein a thickness of the sacrificial layer is about 3-5 times greater than a thickness of the another nitride layer.

8. The method of forming semiconductor memory device according to claim 6, wherein a thickness of the stacked structure is about 1600-2000 angstroms.

9. The method of forming semiconductor memory device according to claim 5, wherein the electrode layer directly contacts the plugs.

10. The method of forming semiconductor memory device according to claim 1, after removing the portion of the sacrificial layer, further comprising:
    performing a lateral etching process to form a plurality of expanding portions in the sacrificial layer, wherein each of the expanding portions is in connection with each of the openings, and the electrode layer is also formed on surfaces of the expanding portions.

11. The method of forming semiconductor memory device according to claim 10, the electrode layer formed on the surface of each expanding portion also forms a corresponding expanding portion.

12. The method of forming semiconductor memory device according to claim 1, wherein the sacrificial layer has an etching selectivity related to materials of the stacked structure.

13. The method of forming semiconductor memory device according to claim 1, wherein the at least one oxide material layer in the stacked structure is completely removed by performing a wet etching process.

* * * * *